(12) United States Patent
Pan

(10) Patent No.: US 9,018,049 B2
(45) Date of Patent: Apr. 28, 2015

(54) METHOD FOR MANUFACTURING INSULATED GATE BIPOLAR TRANSISTOR IGBT

(71) Applicants: Peking University Founder Group Co., Ltd., Beijing (CN); Founder Microelectronics International Co., Ltd., Shenzhen (CN)

(72) Inventor: Guangran Pan, Guangdong Province (CN)

(73) Assignees: Peking University Founder Group Co., Ltd., Beijing (CN); Founder Microelectronics International Co., Ltd., Beijing (CN)

( * ) Notice: Subject to any disclaimer, the term of this patent is extended or adjusted under 35 U.S.C. 154(b) by 0 days.

(21) Appl. No.: 14/093,165

(22) Filed: Nov. 29, 2013

(65) Prior Publication Data

US 2015/0031174 A1    Jan. 29, 2015

(30) Foreign Application Priority Data

Jul. 25, 2013    (CN) .......................... 2013 1 0317624

(51) Int. Cl.
*H01L 21/332*    (2006.01)
*H01L 29/66*    (2006.01)
*H01L 21/3205*    (2006.01)

(52) U.S. Cl.
CPC ............................. *H01L 29/66325* (2013.01)

(58) Field of Classification Search
None
See application file for complete search history.

(56) References Cited

U.S. PATENT DOCUMENTS 5,624,855 A *    4/1997    Sumida .................. 438/135

* cited by examiner

*Primary Examiner* — Calvin Choi
(74) *Attorney, Agent, or Firm* — Workman Nydegger

(57) ABSTRACT

A method for manufacturing an IGBT includes: forming oxide layers on the surfaces of the front and the back of an N-type substrate; forming a buffer layer in the surface of the back of the N-type substrate; forming protection layers on the surfaces of the oxide layers; removing the protection layer and the oxide layer overlying the front of the N-type substrate while reserving the oxide layer and the protection layer on the back of the N-type substrate for protection of the back of the N-type substrate; forming a front IGBT structure and applying a protection film on the surface of the front IGBT structure for protection of the front IGBT structure; removing the protection layer and the oxide layer overlying the back of the N-type substrate; forming a back IGBT structure and a back metal layer; and removing the protection film overlying the surface of the front IGBT structure.

8 Claims, 6 Drawing Sheets

--Prior Art--

METHOD FOR MANUFACTURING INSULATED GATE BIPOLAR TRANSISTOR IGBT

CROSS-REFERENCE TO RELATED APPLICATIONS

The present application claims priority to Chinese Patent Application No. 201310317624.1 filed with the Chinese Patent Office on Jul. 25, 2013 and entitled "method for manufacturing insulated gate bipolar transistor IGBT", which is hereby incorporated by reference in its entirety.

FIELD OF THE INVENTION

The present invention relates to the field of semiconductor devices and particularly to a method for manufacturing an Insulated Gate Bipolar Transistor (IGBT).

BACKGROUND OF THE INVENTION

In recent years, an Insulated Gate Bipolar Transistor (IGBT) has become one of predominant large-power devices in the field of electronically electronic along with rapid development of semiconductor devices.

FIG. 1 is a schematic sectional view of an IGBT in the prior art, and as illustrated in FIG. 1, the IGBT is structurally double-sided, that is, including a front IGBT structure 11 and a back IGBT structure 12, and a back metal layer 13 is further arranged on the surface of the back IGBT structure, so important factors influencing the manufacturing of the device include how to form the front IGBT structure without influencing the back IGBT structure and the back metal layer and how to form the back IGBT structure and the back metal layer without influencing the front IGBT structure of the device.

However it has been difficult to manufacture the foregoing structurally doubled-sided IGBT in the existing IGBT manufacturing method for which the problems identified above have not been addressed effectively.

SUMMARY OF THE INVENTION

The embodiment of the present invention provides a method for manufacturing an Insulated Gate Bipolar Transistor (IGBT) so as to address the problem of being difficult to manufacture a structurally doubled-sided IGBT in the existing solution for manufacturing an Insulated Gate Bipolar Transistor (IGBT).

The embodiment of the present invention provides a method for manufacturing an IGBT, the method includes:
 forming oxide layers on surfaces of the front and the back of an N-type substrate, wherein the oxide layers include a first oxide layer and a second oxide layer, the first oxide layer is the oxide layer overlying the surface of the front of the N-type substrate, and the second oxide layer is the oxide layer overlying the surface of the back of the N-type substrate;
 forming a buffer layer located in the surface of the back of the N-type substrate by implanting N-type impurities and diffusing at high temperature;
 forming protection layers on surfaces of the first oxide layer and the second oxide layer;
 removing the protection layer and the first oxide layer overlying the front of the N-type substrate while reserving the second oxide layer and the protection layer located on the surface of the second oxide layer for protection of the back of the N-type substrate;
 forming a front IGBT structure located on and in the surface of the front of the N-type substrate in a preset first process flow and applying a protection film on a surface of the front IGBT structure for protection of the front IGBT structure;
 removing the protection layer and the second oxide layer overlying the back of the N-type substrate to expose a surface of the buffer layer;
 forming a back IGBT structure located in the surface of the buffer layer in a preset second process flow;
 forming a back metal layer located on a surface of the back IGBT structure in a preset third process flow; and
 removing the protection film overlying the surface of the front IGBT structure.

With the method for manufacturing an IGBT according to this embodiment, the protection layer is formed on the back of the N-type substrate, and then the front IGBT structure is formed, and the protection film is applied to the surface of the front IGBT structure; the protection layer overlying the back of the N-type substrate is removed and the back IGBT structure is formed; and finally the protection film overlying the surface of the front IGBT structure is removed, and such a technical solution makes it possible to manufacture a structurally doubled-sided IGBT.

DETAILED DESCRIPTION OF THE EMBODIMENTS

In order to make the objects, technical solutions and advantages of embodiments of the invention more apparent, the technical solutions in the embodiments of the invention will be described below clearly and fully with reference to the drawings in the embodiments of the invention. For the sake of a convenient description, sizes of respective layers and areas have been amplified or contracted, so the sizes and scales as illustrated may neither necessarily represent real ones nor reflect a proportional relationship between the sizes.

Figure 2:
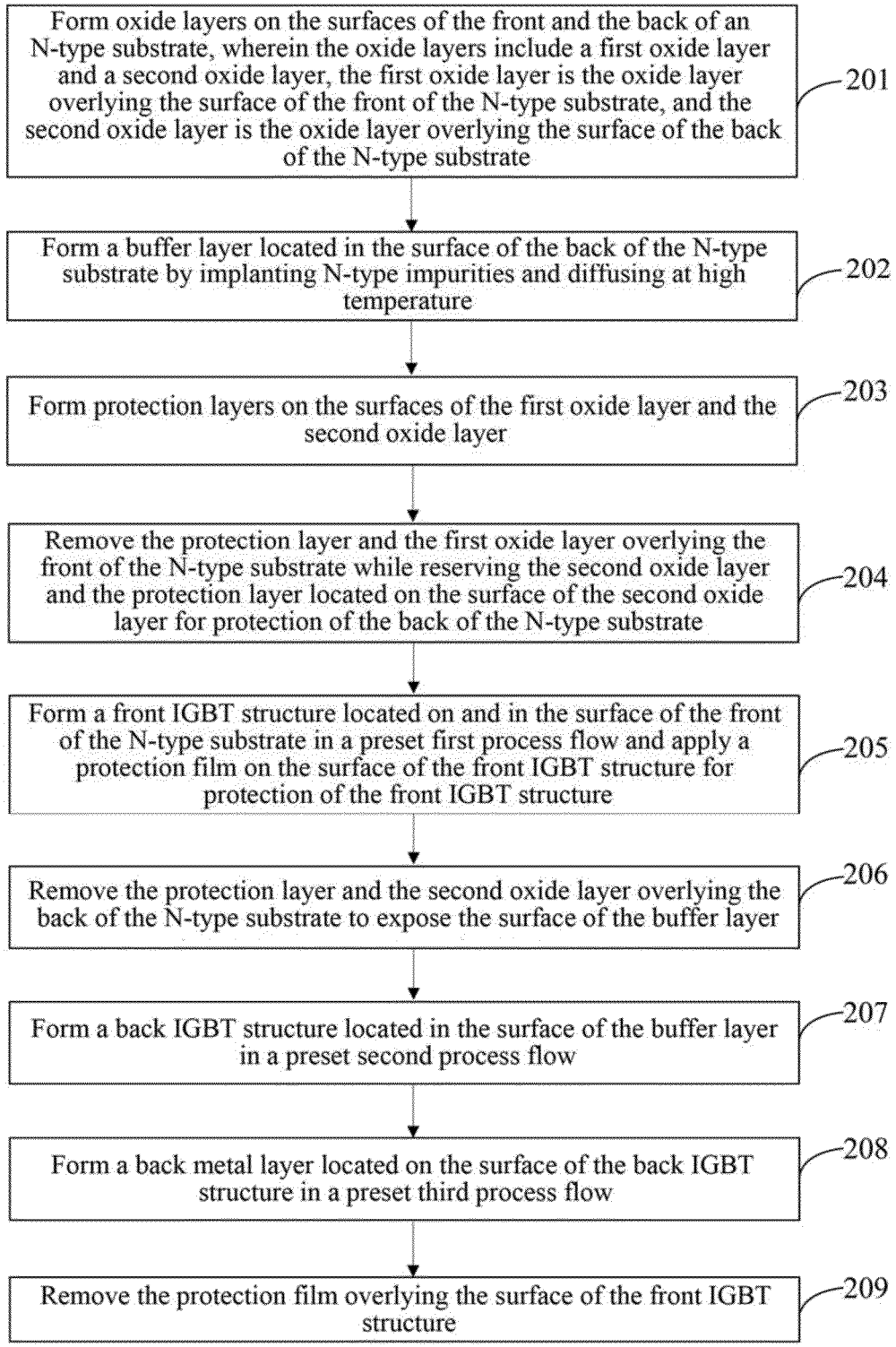
FIG. 2 is a schematic flow chart of a method for manufacturing an IGBT according to a first embodiment of the invention.

FIG. 2 is a schematic flow chart of a method for manufacturing an Insulated Gate Bipolar Transistor (IGBT) according to a first embodiment of the invention, and for the sake of a clear systematic description of the method in this embodiment, FIG. 3 to FIG. 10 are schematic sectional views of the IGBT in an implementation of the first embodiment of the invention. As illustrated in FIG. 2, this method includes the following steps.

Step 201 is to form oxide layers on the surfaces of the front and the back of an N-type substrate (referenced by n- in the figures), where the oxide layers includes a first oxide layer and a second oxide layer, the first oxide layer is the oxide layer overlying the surface of the front of the N-type substrate, and the second oxide layer is the oxide layer overlying the surface of the back of the N-type substrate.

Figure 3:
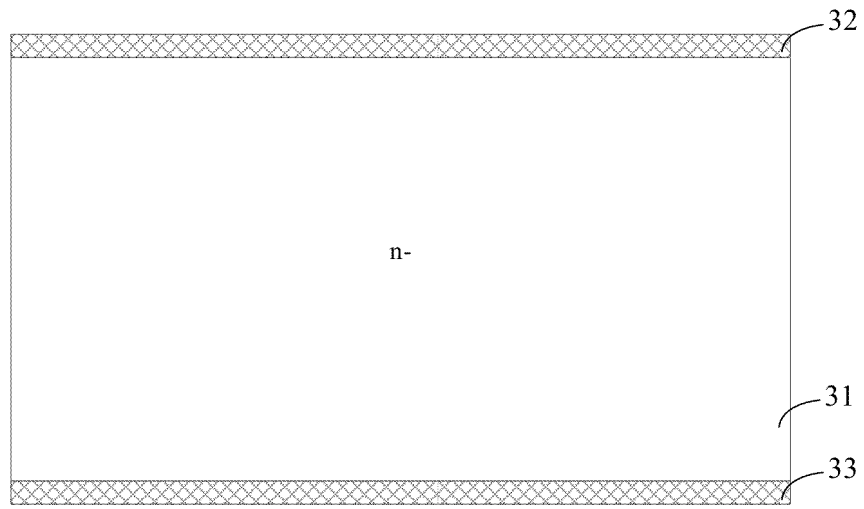
FIG. 3 to FIG. 10 are schematic sectional views of the IGBT in an implementation of the first embodiment of the invention.

Specifically a schematic sectional view of the IGBT after the step 201 is performed is as illustrated in FIG. 3, where the N-type substrate is referenced by 31, the first oxide layer is referenced by 32, and the second oxide layer is referenced by 33.

In a practical application, the N-type substrate can be a lightly doped N-type substrate or can be a lightly doped N-type epitaxial layer. The N-type substrate can be of a semiconductor element, for example, monocrystalline silicon, polycrystalline silicon or amorphous silicon or silicon germanium (SiGe) or can be a hybrid semiconductor structure, for example, silicon carbide, indium antimonide, plumbum telluride, indium arsenide, indium phosphide, gallium arsenide or gallium antimonide, an alloy semiconductor or a combination thereof. This embodiment will not be limited in this respect. Particularly the thickness of the N-type substrate can be determined dependent upon an operating voltage of the IGBT, and specifically in a practical application, an N-type semiconductor wafer chip with the front polished can be used, where the thickness of the wafer chip ranges from 280 to 500 micrometers and the resistivity thereof ranges from 60 to 200 ohms*centimeter. Optionally the thickness of the oxide layer can range from 500 to 10000 angstroms for the purpose of protecting the front of the wafer chip.

Step 202 is to form a buffer layer (referenced by n-buffer in the figures) located in the surface of the back of the N-type substrate by implanting N-type impurities and diffusing at high temperature.

Figure 4:
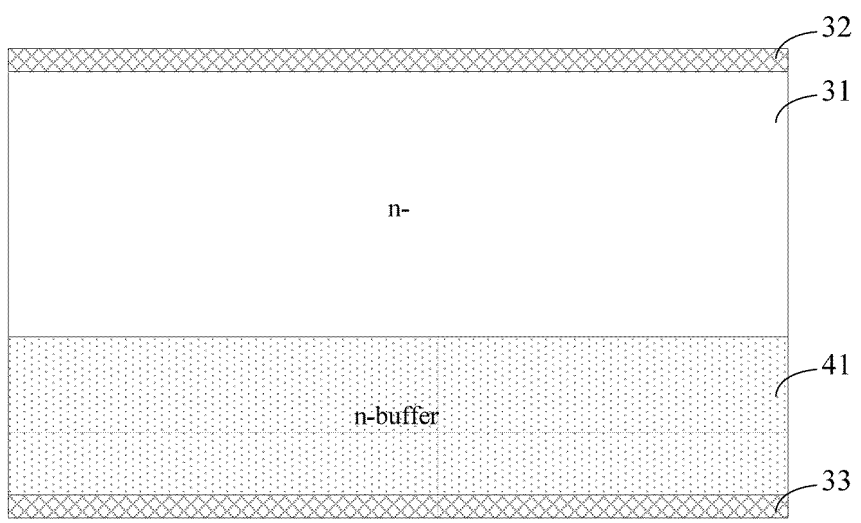

Specifically a schematic sectional view of the IGBT after the step 202 is performed is as illustrated in FIG. 4, where the buffer layer is referenced by 41.

Particularly the thickness of the buffer layer can also be determined dependent upon the operating voltage of the IGBT. In a practical application, the step 202 can be performed in an ion implant process and a high-temperature furnace process. A condition of the high-temperature furnace process can be 1050 to 1230 centigrade and 2 to 40 hours for the buffer layer to reach a prescribed thickness.

Step 203 is to form protection layers on the surfaces of the first oxide layer and the second oxide layer.

Figure 5:
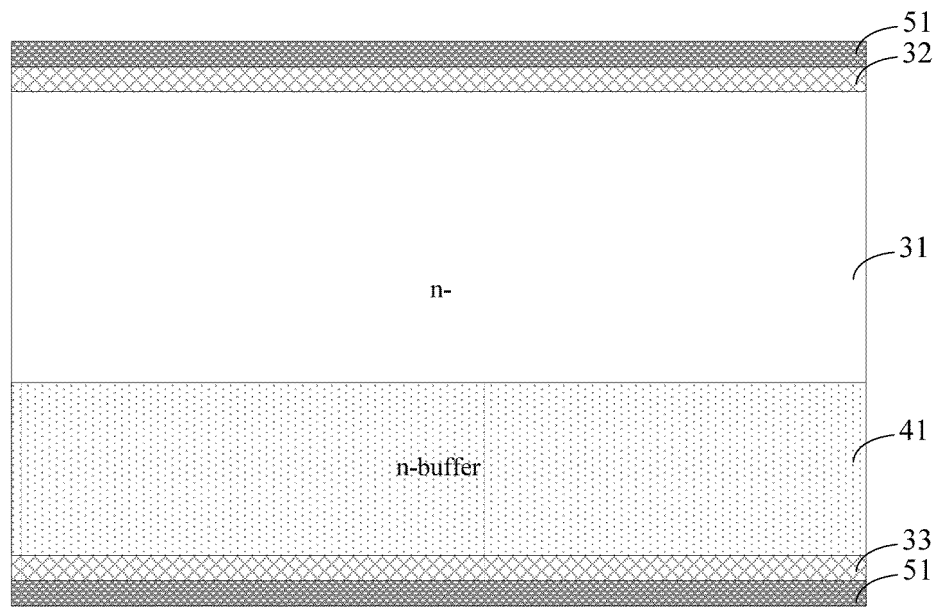

Specifically a schematic sectional view of the IGBT after the step 203 is performed is as illustrated in FIG. 5, where the protection layer is referenced by 51.

Particularly the protection layer can be a silicon nitride layer, or the protection layer can include an oxide layer and a polycrystalline silicon layer, and correspondingly the step 203 can particularly includes: forming the oxide layer and the polycrystalline silicon layer in that order on the surfaces of the first oxide layer and the second oxide layer. More specifically both the thickness of the oxide layer in the protection layer and the thickness of the polycrystalline silicon layer in the protection layer can no less than 2000 angstroms and no more than 20000 angstroms.

Step 204 is to remove the protection layer and the first oxide layer overlying the front of the N-type substrate while reserving the second oxide layer and the protection layer located on the surface of the second oxide layer for protection of the back of the N-type substrate.

Figure 6:
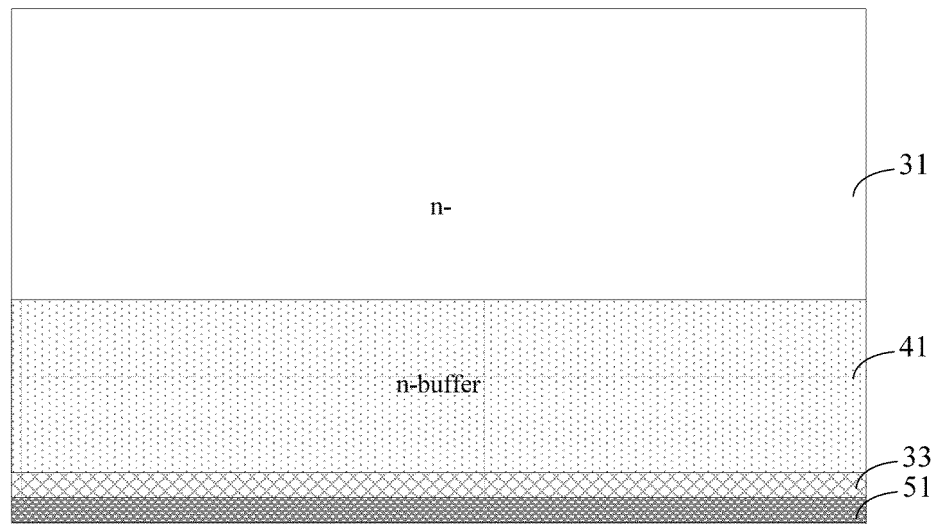

Specifically a schematic sectional view of the IGBT after the step 204 is performed is as illustrated in FIG. 6. In a practical application, the protection layer and the first oxide layer overlying the front of the N-type substrate can be removed in dry etch and wet etch processes.

Step 205 is to form a front IGBT structure located on and in the surface of the front of the N-type substrate in a preset first process flow and to apply a protection film on the surface of the front IGBT structure for protection of the front IGBT structure.

Figure 7:
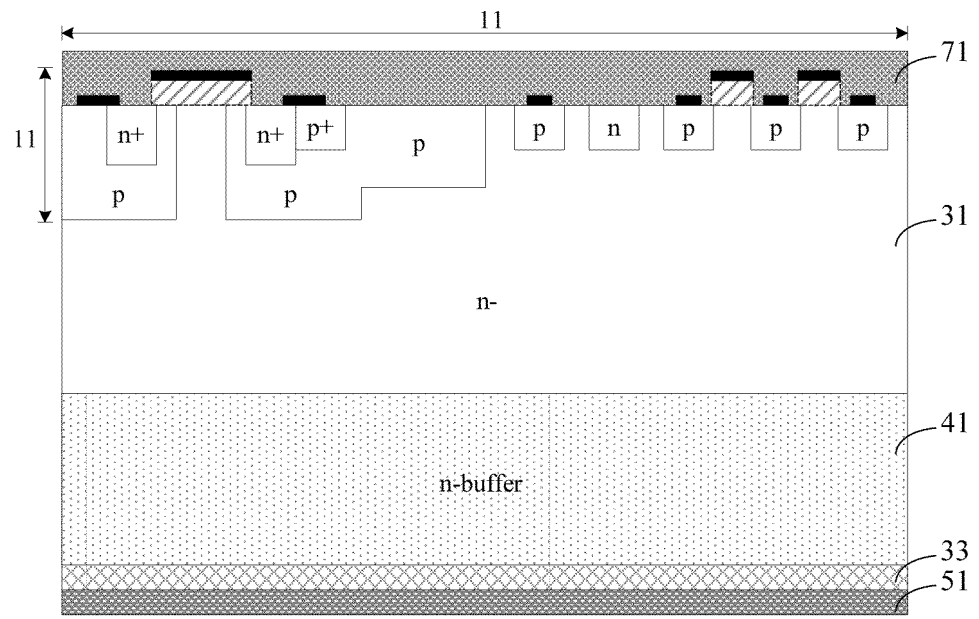

Typically the protection film can undergo high temperature of 250 centigrade as well as acid and alkaline erosion for the purpose of protecting the front IGBT structure. Specifically a schematic sectional view of the IGBT after the step 205 is performed is as illustrated in FIG. 7, where the front IGBT structure is referenced by 11, and the protection film is referenced by 71. As can be appreciated, the front IGBT structure can alternatively be another structure, and the structure as illustrated is merely a particular implementation thereof without limitation thereto. Specifically in a practical application, the front IGBT structure as illustrated can be implemented in numerous semiconductor process flows, so a further description of its particular process flow will be omitted here.

Step 206 is to remove the protection layer and the second oxide layer overlying the back of the N-type substrate to expose the surface of the buffer layer.

Figure 8:
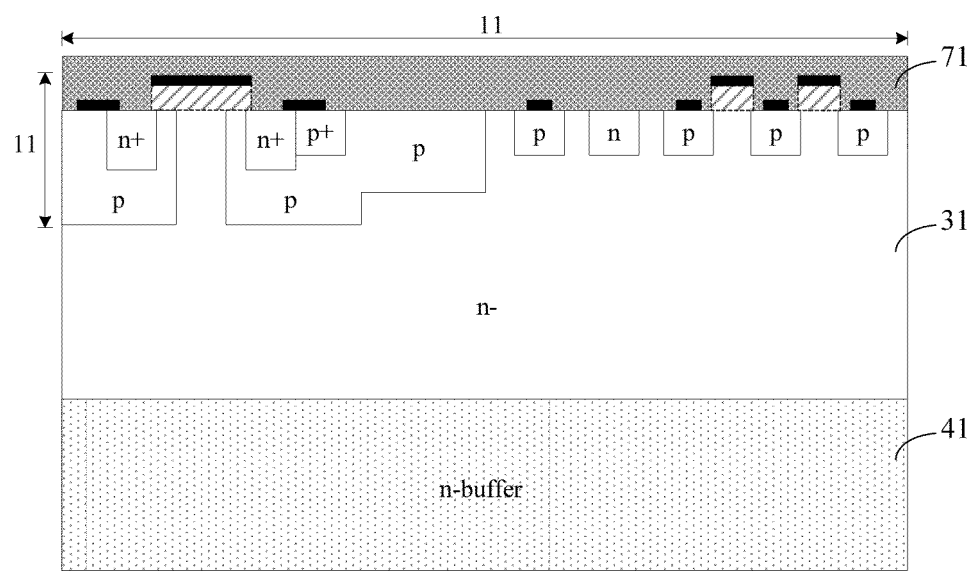

Specifically a schematic sectional view of the IGBT after the step 206 is performed is as illustrated in FIG. 8.

In a practical application, the step 206 can particularly include: removing the protection layer and the second oxide layer overlying the surface of the back of the N-type substrate through polishing or removing the protection layer and the second oxide layer overlying the surface of the back of the N-type substrate through dry etching and wet etching.

Step 207 is to form a back IGBT structure located in the surface of the buffer layer in a preset second process flow.

Figure 9:
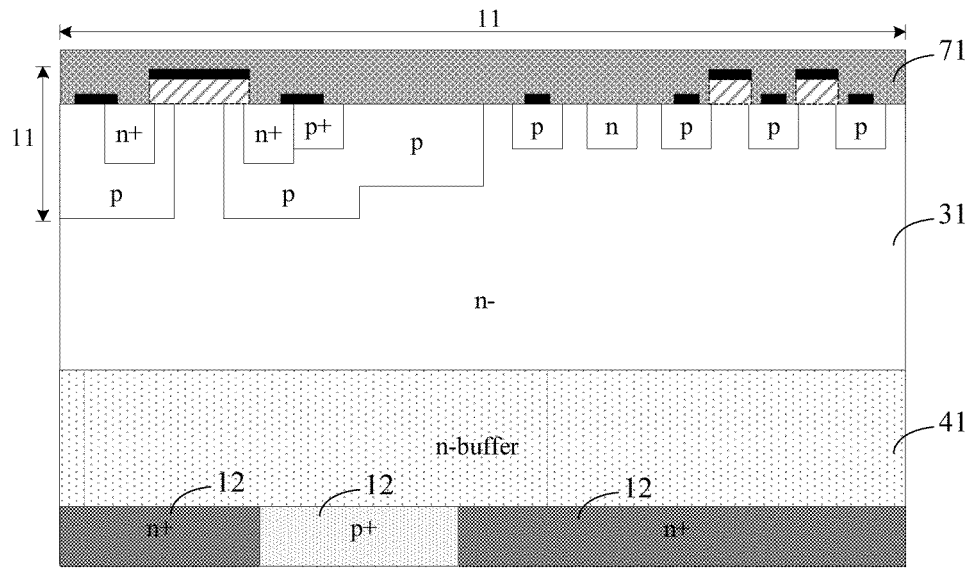

Specifically a schematic sectional view of the IGBT after the step 207 is performed is as illustrated in FIG. 9, where the back IGBT structure is referenced by 12.

As can be appreciated alike, the back IGBT structure can alternatively be another structure, and the structure as illustrated is merely a particular implementation without limitation thereto. Specifically in a practical application, the back IGBT structure as illustrated can be implemented in numerous semiconductor process flows, and in a particular example, the step 207 can include:

N-type impurities are implanted into the surface of the buffer layer to form an N-type area located in the surface of the buffer layer, where the depth of the N-type area is below the depth of the buffer layer;

Photo-resist is applied on the surface of the N-type area;

Photo-resist in a first preset area is removed through photolithography to expose the surface of the N-type area to form a window;

P-type impurities are implanted into the window to form a P-type area located in the surface of the buffer layer, where the depth of the P-type area is below the depth of the buffer layer; and Photo-resist overlying the surface of the buffer layer is removed.

Optionally after the step 207, the method further includes:

The protection film overlying the surface of the front IGBT structure is removed and an annealing process is performed; and A protection film is applied again on the surface of the front IGBT structure.

With the foregoing implementation, impurity ions implanted in the back IGBT structure can be activated in the annealing process. Specifically in a practical application, a condition of the annealing process can be 350 to 450 centigrade and 30 to 120 minutes.

Step 208 is to form a back metal layer located on the surface of the back IGBT structure in a preset third process flow.

Figure 10:
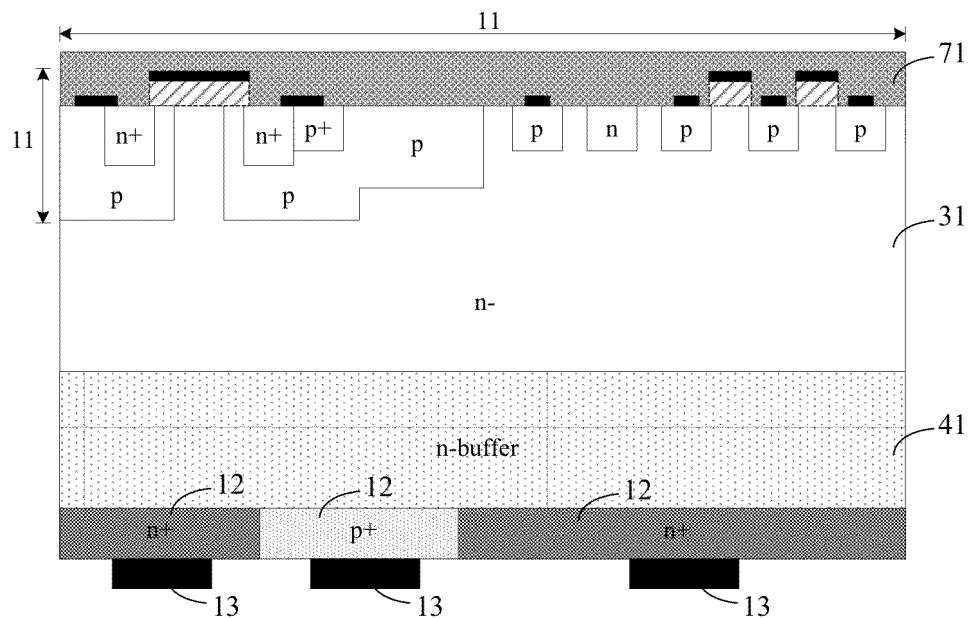

Specifically a schematic sectional view of the IGBT after the step 208 is performed is as illustrated in FIG. 10, where the back metal layer is referenced by 13. Particularly the material of the metal layer can be gold, silver, aluminum, platinum or molybdenum, and a particular selection of the material can depend upon a practical condition. In a particular example, the metal layer can be a stack layer of one of titanium and vanadium, nickel, and one of silver and gold.

In a practical application, the step 208 can be performed in numerous semiconductor process flows, and in a particular example, the step 208 can include:

Photo-resist is applied on the surface of the back IGBT structure;

Photo-resist in a second preset area is removed through photolithography to expose the surface of the back IGBT structure to form a window while reserving photo-resist in an area other than the second preset area;

A metal layer is formed on the surface of the window and on the surface of photo-resist in the area other than the second preset area through evaporation;

A viscous film is applied on the surface of the metal layer; and

The viscous film is stripped to remove photo-resist in the area other than the second preset area and the metal layer on the surface of photo-resist in the area other than the second preset area while reserving the metal layer located on the surface of the back IGBT structure.

Step 209 is to remove the protection film overlying the surface of the front IGBT structure.

Figure 1:
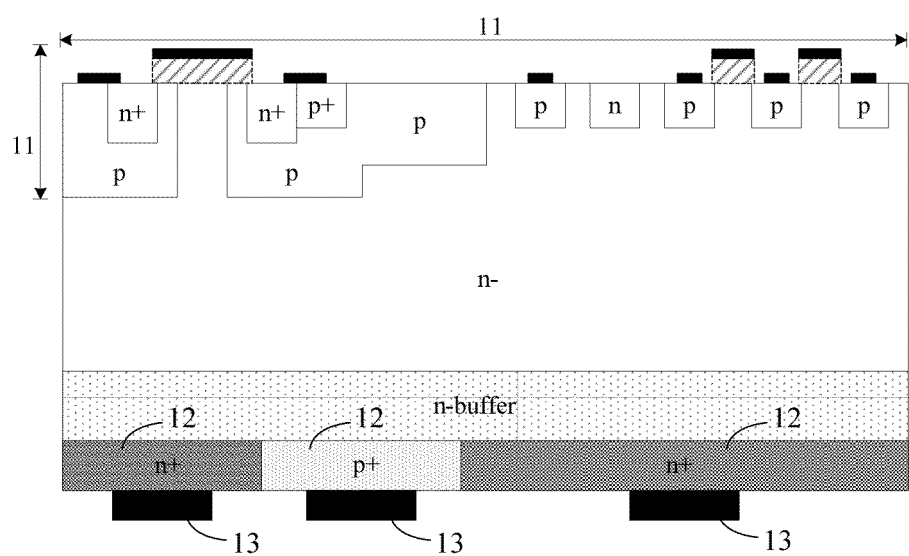
FIG. 1 is a schematic sectional view of an IGBT in the prior art.

Specifically a schematic sectional view of the IGBT after the step 209 is performed is as illustrated in FIG. 1.

It shall be noted that "−" as illustrated in the figures in this embodiment represents a lightly doped area, for example, n− and p− represent a lightly doped N-type area and a lightly doped P-type area respectively; and "+" represents a heavily doped area, for example, n+ and p+ represent a heavily doped N-type area and a heavily doped P-type area respectively. Particular doping concentrations of the respective areas can be determined dependent upon an operating characteristic of the IGBT but will not be limited here.

As can be appreciated, the front IGBT structure, the back IGBT structure and the back metal layer in the respective figures in this embodiment are merely particular examples of an IGBT in the prior art, and the front IGBT structure, the back IGBT structure and the back metal layer in the method for manufacturing an IGBT in this embodiment can alternatively be other structures than those as illustrated. Correspondingly the first process flow, the second process flow and the third process flow will not be limited to the flows provided in the embodiment either.

With the method for manufacturing an IGBT according to this embodiment, the protection layer is formed on the back of the N-type substrate, and then the front IGBT structure is formed, and the protection film is applied to the surface of the front IGBT structure; the protection layer overlying the back of the N-type substrate is removed and then the back IGBT structure is formed; and finally the protection film overlying the surface of the front IGBT structure is removed, and such a technical solution makes it possible to manufacture a structurally doubled-sided IGBT.

Lastly it shall be noted that the foregoing respective embodiments are merely illustrative of the technical solution of the invention but not to limit the same; and although the invention has been detailed above in connection with the foregoing embodiments, those ordinarily skilled in the art shall appreciate that they can modify the technical solution disclosed in the foregoing respective embodiments or make equivalent substitutions for a part or all of the technical features without departing from the scope of the invention.

The invention claimed is:

1. A method for manufacturing an Insulated Gate Bipolar Transistor, IGBT, comprising:

forming oxide layers on surfaces of the front and the back of an N-type substrate, wherein the oxide layers comprise a first oxide layer and a second oxide layer, the first oxide layer is the oxide layer overlying the surface of the front of the N-type substrate, and the second oxide layer is the oxide layer overlying the surface of the back of the N-type substrate;

forming a buffer layer located in the surface of the back of the N-type substrate by implanting N-type impurities and diffusing at high temperature;

forming protection layers on surfaces of the first oxide layer and the second oxide layer;

removing the protection layer and the first oxide layer overlying the front of the N-type substrate while reserving the second oxide layer and the protection layer located on the surface of the second oxide layer for protection of the back of the N-type substrate;

forming a front IGBT structure located on and in the surface of the front of the N-type substrate in a preset first process flow and applying a protection film on a surface of the front IGBT structure for protection of the front IGBT structure;

removing the protection layer and the second oxide layer overlying the back of the N-type substrate to expose a surface of the buffer layer;

forming a back IGBT structure located in the surface of the buffer layer in a preset second process flow;

forming a back metal layer located on a surface of the back IGBT structure in a preset third process flow; and removing the protection film overlying the surface of the front IGBT structure.

2. The method according to claim 1, wherein the protection layer comprises an oxide layer and a polycrystalline silicon layer; and wherein forming the protection layers on the surfaces of the first oxide layer and the second oxide layer comprises:

forming the oxide layer and the polycrystalline silicon layer in that order on the surfaces of the first oxide layer and the second oxide layer.

3. The method according to claim 2, wherein both the thickness of the oxide layer in the protection layer and the thickness of the polycrystalline silicon layer in the protection layer are no less than 2000 angstroms and no more than 20000 angstroms.

4. The method according to claim 1, wherein removing the protection layer and the second oxide layer overlying the back of the N-type substrate comprises:

removing the protection layer and the second oxide layer overlying the surface of the back of the N-type substrate through polishing; or removing the protection layer and the second oxide layer overlying the surface of the back of the N-type substrate through dry etching and wet etching.

5. The method according to claim 1, wherein after forming the back IGBT structure located in the surface of the buffer layer in the preset second process flow, the method further comprises:

removing the protection film overlying the surface of the front IGBT structure and performing an annealing process; and applying a protection film again on the surface of the front IGBT structure.

6. The method according to claim 1, wherein forming the back IGBT structure located in the surface of the buffer layer in the preset second process flow comprises:

- implanting N-type impurities into the surface of the buffer layer to form an N-type area located in the surface of the buffer layer, wherein the depth of the N-type area is below the depth of the buffer layer;
- applying photo-resist on a surface of the N-type area;
- removing photo-resist in a first preset area through photo-lithography to expose the surface of the N-type area to form a window;
- implanting P-type impurities into the window to form a P-type area located in the surface of the buffer layer, wherein the depth of the P-type area is below the depth of the buffer layer; and
- removing photo-resist overlying the surface of the buffer layer.

7. The method according to claim 5, wherein forming the back IGBT structure located in the surface of the buffer layer in the preset second process flow comprises:

- implanting N-type impurities into the surface of the buffer layer to form an N-type area located in the surface of the buffer layer, wherein the depth of the N-type area is below the depth of the buffer layer;
- applying photo-resist on a surface of the N-type area;
- removing photo-resist in a first preset area through photo-lithography to expose the surface of the N-type area to form a window;
- implanting P-type impurities into the window to form a P-type area located in the surface of the buffer layer, wherein the depth of the P-type area is below the depth of the buffer layer; and
- removing photo-resist overlying the surface of the buffer layer.

8. The method according to claim 1, wherein forming the back metal layer located on the surface of the back IGBT structure in the preset third process flow comprises:

- applying photo-resist on the surface of the back IGBT structure;
- removing photo-resist in a second preset area through photolithography to expose the surface of the back IGBT structure to form a window while reserving photo-resist in an area other than the second preset area;
- forming a metal layer on a surface of the window and on a surface of photo-resist in the area other than the second preset area through evaporation;
- applying a viscous film on a surface of the metal layer; and
- stripping the viscous film to remove photo-resist in the area other than the second preset area and the metal layer on the surface of photo-resist in the area other than the second preset area while reserving the metal layer located on the surface the back IGBT structure.

\* \* \* \* \*